(12) United States Patent
Takahashi (10) Patent No.: US 6,323,691 B1
(45) Date of Patent: Nov. 27, 2001

(54) LOGIC CIRCUIT

(75) Inventor: Hiroyuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/449,029

(22) Filed: Nov. 24, 1999

(30) Foreign Application Priority Data

Nov. 30, 1998 (JP) ................................................ 10-338863

(51) Int. Cl.[7] .................................................. H03K 19/0948
(52) U.S. Cl. ........................ 326/121; 326/106; 326/108; 326/119
(58) Field of Search .................................... 326/119, 121, 326/112, 106, 108

(56) References Cited

U.S. PATENT DOCUMENTS 5,490,119 * 2/1996 Sakurai et al. .................. 365/230.08
5,694,061 * 12/1997 Morosawa et al. .................. 326/119
5,990,706 * 11/1999 Matsumoto et al. .................. 326/98

* cited by examiner

*Primary Examiner*—Michael Tokar
*Assistant Examiner*—Anh Tran
(74) *Attorney, Agent, or Firm*—Darryl G. Walker (57) ABSTRACT

According to one embodiment (100), high speed, reduced power logic circuits (114-1 to 114-16) can have load impedances that are changed synchronously with input signals. A load impedance control circuit (104) can provide a load impedance control signal LC synchronously with a clock signal CLK. The amplitude of the load impedance control signal LC can be less than a power supply voltage VCC. The load impedance control signal LC can be supplied to the gate of a PMOS load transistor (116) in a logic circuit (114-1). When NMOS logic transistors (118 and 120) are turned on, PMOS load transistor (116) can have a high impedance due to the load impedance control signal LC. In this way, the potential at the input of inverter (122) can be rapidly changed to quickly obtain a decoder output value X0.

18 Claims, 5 Drawing Sheets

LOGIC CIRCUIT

TECHNICAL FIELD

The present invention relates generally to logic circuits that may be used in a semiconductor memory, and more particularly to logic circuits that may be used in semiconductor memory decoder circuits.

BACKGROUND OF THE INVENTION

Semiconductor memories can include a number of storage locations that can be accessed by the application of an address value. Address values can be received in binary form and subsequently decoded by decoder circuits to access one or more storage locations. In such arrangements, a decoder circuit can have a considerable impact on the access time of a semiconductor memory. Faster semiconductor memories can lead to faster and more powerful electronic systems.

Figure 9:
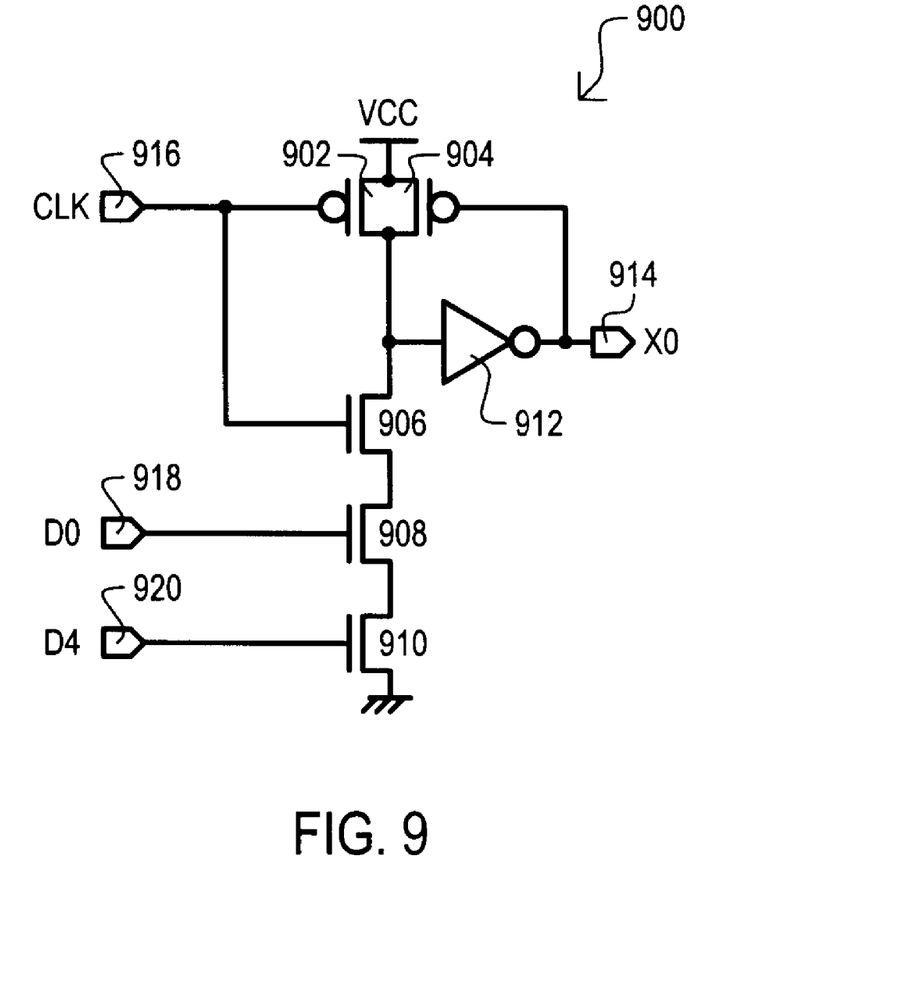
FIG. 9 is a schematic diagram of a conventional decoder circuit.

FIG. 9 sets forth a schematic diagram of a conventional decoder circuit. The conventional decoder circuit is a logic circuit designated by the general reference character 900. The logic circuit 900 can include p-channel and n-channel field-effect transistors (FETs) which will be referred to herein as a particular type of FET, the metal-oxide-semiconductor FET (MOSFET). Accordingly, p-channel FETs will be referred to as PMOS transistors and n-channel FETs will be referred to as NMOS transistors.

Logic circuit 900 includes PMOS transistors 902 and 904 that can serve as load devices and NMOS transistors 906, 908 and 910 that perform logic functions. An inverter 912 can invert a logic value. An output terminal is shown as item 914 and input terminals are shown as items 916, 918 and 920.

PMOS transistors 902 and 904 can be connected to one another in parallel. The sources of PMOS transistors (902 and 904) can be connected to a positive power supply VCC. NMOS transistors 906, 908 and 910 can be connected in series to one another, and to PMOS transistors 902 and 904. The source of NMOS transistor 910 can be connected to a reference power supply (e.g., "ground"). The general arrangement of transistors (902 to 910) can be conceptualized as a three input NAND gate.

Logic circuit 900 can include an internal terminal formed by the drain-drain connection of PMOS transistors 902/904 and NMOS transistor 906. The internal terminal can be connected to the input terminal of inverter 912. The output terminal of inverter 912 can be connected to the gate of transistor 904 and output terminal 914.

Input terminal 916 can be a clock input terminal that receives a clock signal CLK and is connected to the gate of PMOS transistor 902 and the gate of NMOS transistor 906. Input terminal 918 can be a first signal input terminal that receives a signal D0 and is connected to the gate of NMOS transistor 908. Input terminal 920 can be a second signal input terminal that receives a signal D4 and is connected to the gate of NMOS transistor 910.

The operation of the conventional logic circuit 900 will now be described. Initially, the CLK signal supplied to clock input terminal 916 can be at a low logic level. PMOS transistor 902 can be in an active state and provide a relatively low load impedance. The input terminal of inverter 912 can be pulled to a logic high value. The high value can be inverted by inverter 912 resulting in output terminal 914 being driven low.

When the output of inverter 912 is low, PMOS transistor 904 can be in an active state and provide a relatively low load impedance. In this arrangement, even if clock signal CLK transitions high, turning off transistor 902, the internal terminal can remain high. The high internal terminal can be inverted by inverter 912, keeping PMOS transistor 904 in the active state. Thus, the output terminal 914 can remain low (assuming that an NMOS transistor 908 or 910 remains turned off).

In the event the CLK signal is at a high level at the same time the D0 and D4 signals are at a high level, NMOS transistors 906, 908 and 910 can be activated. The D0 and D4 signals could be generated by predecoder circuits (not shown) that can "predecode" applied address values. If NMOS transistors 906, 908 and 910 are activated, the three transistors can "sink" more current than PMOS transistor 904 can "source" and the potential of the internal node (the input terminal of inverter 912) can be pulled low. This value is inverted by inverter 912 resulting in output terminal 914 being driven high. A logic high at output terminal 914 can turn off PMOS transistor 904. With PMOS transistor 904 turned off, essentially no current will flow through the source-drain paths of PMOS transistor 904 and NMOS transistors 906, 908 and 910. The resulting logic high at output terminal 914 can be an active decode output X0.

Thus, in the conventional logic circuit 900, a decode output X0 in response to input signals D0 and D4 can be generated when the CLK signal transitions to a logic high level.

As noted above, in a conventional logic circuit approach such as that set forth in FIG. 9, the series arrangement of NMOS transistors 906, 908 and 910 must sink enough current to lower the potential at the input terminal of inverter 912. The potential must be lowered enough to cause the output of inverter 912 to be high enough to begin to turn off PMOS transistor 904. Thus, unless the current sinking capacity of NMOS transistors 906, 908 and 910 is substantially larger than the current sourcing capacity of PMOS transistor 904, it may take a considerable amount of time to lower the potential at the input terminal of inverter 912. This can increase the time between transitions in the CLK signal and input signals D0 and D4 and a resulting active decode output X0. Consequently, the operating speed of a conventional logic circuit can be limited.

Another drawback to conventional logic circuit approaches can be the current consumed by the logic circuit. In the particular case of FIG. 9, current can flow through PMOS transistor 904 and NMOS transistors 906, 908 and 910 until the output of inverter 912 turns off transistor 904.

One skilled in the art would recognize that current consumption and peak current requirements can be important aspects of an integrated circuit.

In the arrangement of FIG. 9, the operating speed of the logic circuit 900 may be increased by decreasing the current sourcing capacity of PMOS transistor 904 without any corresponding decrease in the current sinking capacity of NMOS transistors 906, 908 and 910. While such an arrangement may increase the speed at which the input terminal of inverter 912 transitions from high to low, such an arrangement may also decrease the speed at which the input terminal of inverter 912 transitions from low to high.

SUMMARY OF THE INVENTION

It is an object of present invention to provide a logic circuit that can have a higher speed and lower current consumption than conventional circuits, such as that described above. Such a logic circuit can change the impedance of a load field effect transistor synchronously with an input signal.

A logic circuit according to one embodiment of the present invention can include at least one logical operation transistor that can perform a logic operation in response to a number of input signals and a load transistor that can serve as a load for the logical operation transistor. A load impedance control circuit can be provided that changes the impedance of the load transistor by controlling the potential of a load transistor control terminal.

Because a load impedance control circuit according to the present invention can be provided that changes the impedance of a load transistor, the impedance of the load transistor can be changed in synchronism with an expected change in an output signal of the logic circuit. Two particular examples are described below.

As a first example, a logic circuit may include a load transistor and a logical operation transistor. The logic circuit can provide a logic low output value by activating the logical operation transistor and sinking current sourced by the load transistor. The speed of the logic circuit may be increased and the current consumption decreased by increasing the impedance of the load transistor. When a logic high value is to be output, the speed of the logic circuit may be increased by decreasing the impedance of the load transistor.

As a second example, a logic circuit may include a load transistor and a logical operation transistor. The logic circuit can provide a logic high output value by activating the logical operation transistor and sourcing current to the load transistor. The speed of the logic circuit may be increased and the current consumption decreased by increasing the impedance of the load transistor. When a logic low value is to be output, the speed of the logic circuit may be increased by decreasing the impedance of the load transistor.

According to one aspect of the embodiments, the transistors can be field effect transistors.

DETAILED DESCRIPTION OF THE EMBODIMENTS

Various embodiments of the present invention will now be described in conjunction with a number of figures.

Figure 1:
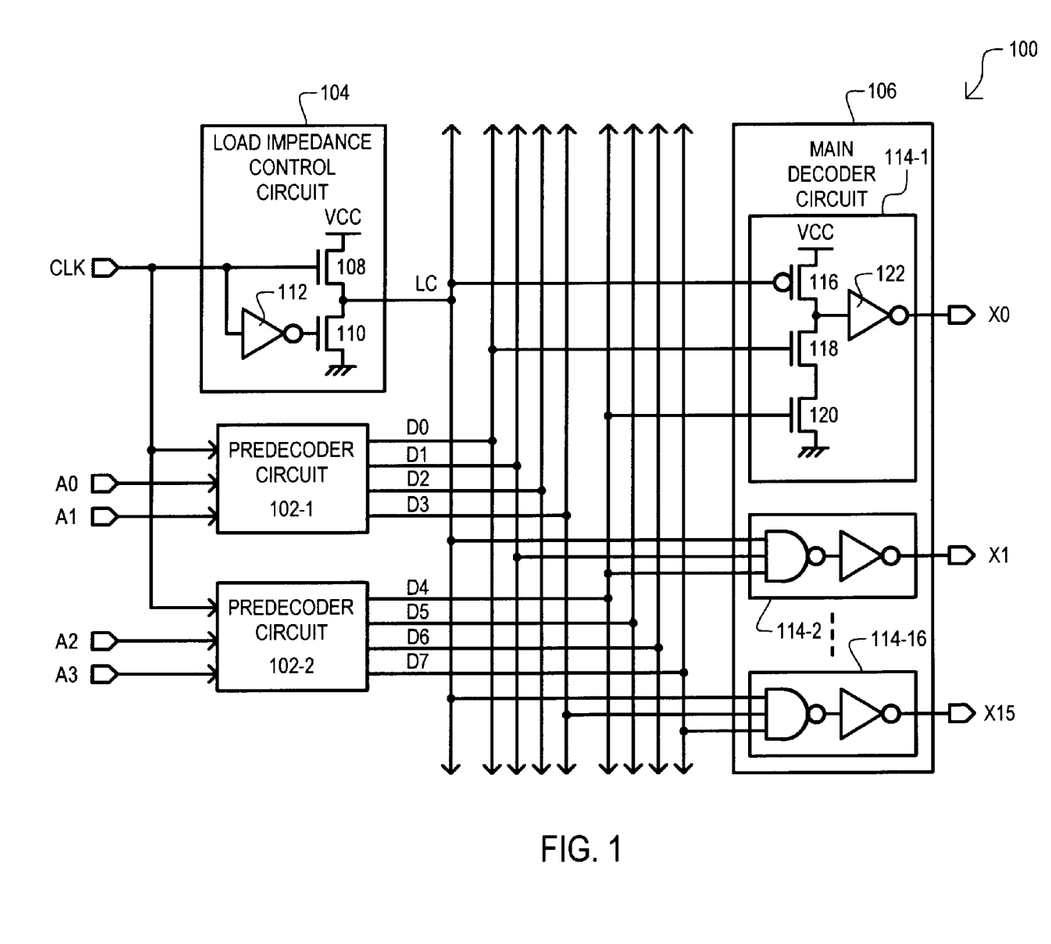
FIG. 1 is a block diagram showing a decoder circuit that may employ logic circuits according to one embodiment of the present invention.

Referring now to FIG. 1, a block diagram is set forth illustrating a decoder circuit that may employ logic circuits according to the present invention. A decoder circuit is designated by the general reference character 100 and can include predecoder circuits 102-1 and 102-2, a load impedance control circuit 104, and a main decoder circuit 106.

A first predecoder circuit 102-1 can receive two lower order bits A0 and A1 of an address and a clock signal CLK. The address bits A0 and A1 can be predecoded synchronously with the CLK signal to provide four predecoder output signals D0 to D3. One of the four predecoder output signals D0 to D3 can be activated (driven high for example) according to each combination of A0 and A1 values. For example, one of the output values D0 to D3 can be driven high during the high portion of clock signal CLK.

In a similar fashion, a second predecoder circuit 102-2 can predecode higher order address bits A3 and A2 and activate one of four predecoder output signals D4 to D7 synchronously with the clock signal CLK.

The load impedance control circuit 104 can include n-channel insulated gate field effect transistors (FET) 108 and 110 (referred to herein as NMOS transistors) and an inverter 112. NMOS transistor 108 can have a drain connected to a positive power supply VCC, a source connected to the drain of NMOS transistor 110, and a gate that receives the clock signal CLK. NMOS transistor 110 can have a source connected to a reference power supply (e.g., grounded) and a gate connected to the output of inverter 112. The input of inverter 112 can receive the clock signal CLK. In this arrangement, an inverted clock signal can be supplied to the gate of NMOS transistor 110. The load impedance control circuit 104 can provide a load impedance control signal LC at the source-drain connection of NMOS transistors 108 and 110.

When the clock signal CLK is high, the load impedance control signal LC can be driven to a voltage VCC−Vtn, where Vtn is the threshold voltage of NMOS transistor 108. When the clock signal CLK is low, the load impedance control signal LC can be driven to essentially the reference voltage.

The main decoder circuit 106 can include sixteen AND function circuits 114-1 to 114-16. The main decoder circuit 106 can receive the predecoder output signals D0 to D3 and D4 to D7 from predecoder circuits 102-1 and 102-2. In response to the various combinations of D0 to D3 and D4 to D7 values the main decoder circuit 106 can activate one of sixteen decoder output signals X0 to X15. Further, decoder output signals X0 to X15 can be activated in synchronism with the clock signal CLK. As just one example, one of the decoder output signals X0–X15 can be driven high when the CLK signal transitions high.

Each of the AND function circuits (114-1 to 114-16) can include a PMOS transistor 116, two NMOS transistors 118 and 120, and an inverter 122. PMOS transistor 116 can be a load transistor that includes a source connected to a positive power supply VCC, a drain connected to the drain of NMOS transistor 118 and the input or inverter 122, and a gate that receives the load impedance control signal LC. NMOS transistor 118 can be a logical operation transistor that has a drain connected to the drain of PMOS transistor 116, a gate that receives a predecode output signal (such as D0 to D7), and a source connected to the drain of NMOS transistor 120. NMOS transistor 120 can be another logical operation transistor that has a gate that receives a predecode output signal (such as D0 to D7) and a source connected to a reference supply voltage.

As shown in FIG. 1, predecoder output signal D0 can be received by the gate of NMOS transistor 118 within AND function circuit 114-1, and predecoder output signal D4 can be received by NMOS transistor 120 within AND function circuit 114- 1.

Figure 2:
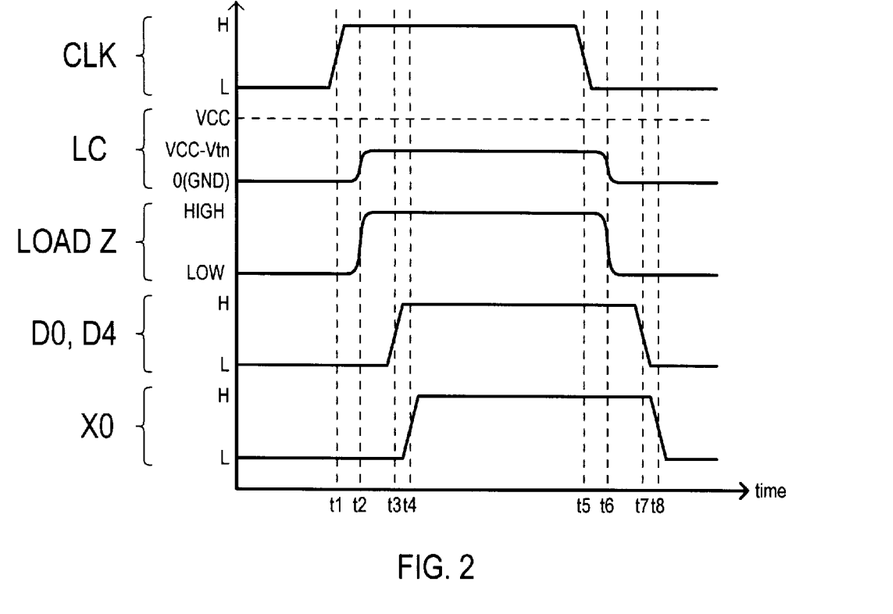
FIG. 2 is a timing diagram illustrating the operation of the decoder circuit of FIG. 1.

Referring now to FIG. 2, a timing diagram is set forth illustrating the operation of the decoder circuit of FIG. 1.

FIG. 2 includes a number of waveforms, including a clock signal CLK, load impedance control signal LC, a load transistor impedance LOAD Z, predecoder output signals D0, D4, and a decoder output signal X0.

One skilled in the art would recognize that waveforms D0, D4, and X0 can illustrate the particular operation of AND function circuit 114-1, and that the other AND function circuits 114-2 to 114-16 could operate in a similar fashion, but can receive different combinations of predecoder output signals.

Referring now to FIG. 2 in conjunction with FIG. 1, when the CLK signal is at a low level, the output of inverter 112 in load impedance control circuit 104 is driven high. With a high level at the gate of NMOS transistor 110, NMOS transistor 110 turns on and the load impedance control signal is driven essentially to the reference voltage supply (e.g., grounded).

The low load impedance control signal LC can be applied to the gate of PMOS transistor 116 within AND function circuit 114-1. PMOS transistor 116, which can function as a load for corresponding NMOS transistors 118 and 120, can be activated and placed into a low impedance state.

At time t1, the CLK signal can transition to a high level. Consequently, at time t2, NMOS transistor 108 can be activated and the load impedance control signal LC can be driven to a level of VCC−Vtn. The VCC−Vtn level can be applied to the gate PMOS transistor 116 and the load impedance (LOAD Z) of PMOS transistor 116 can be raised.

At the same time that the CLK signal transitions to a high level at time t1, predecoder circuits 102-1 and 102-2 are activated. In the example of FIG. 2, it is assumed that address bits A0 to A3 are low, and further, that such an address bit combination results in the D0 and D4 signals being driven high. However, because the number of logic stages that within a predecoder circuit (102-1 and 102-2) can be larger than the number of stages within the load impedance circuit 104, the D0 and D4 signals can transition high at time t3.

The high D0 and D4 signals can be applied to the gates of NMOS transistors 118 and 120, respectively, within AND function circuit 114-1. NMOS transistors 118 and 120 can be activated, and the input of inverter 122 can be driven low. The low input can be inverted by inverter 122 resulting in the decoder output X0 being driven high at time t4.

At time t5 the CLK signal can transition low. By operation of the load impedance control circuit 104, the load impedance control signal LC is driven essentially to the reference power supply at time t6. PMOS transistor 116 can thus return to a low impedance state.

The low CLK signal can result in the D0 and D4 signals returning low at time t7. With the D0 and D4 signals both low, NMOS transistors 118 and 120 can be turned off, and the input of inverter 122 can return high. The high input is inverted by inverter 122 to generate a low decoder output signal X0 at time t8.

In the period between time t6 and t7, NMOS transistors 118 and 120 can be activated while PMOS transistor 116 has a low impedance. The AND function circuits 114-1 can be arranged so that the PMOS load transistor 116 continues to function as a load. For example, the PMOS load transistor 116 can source less current than logical operation NMOS transistors 118 and 120 can sink. Therefore, when PMOS transistor 116 and NMOS transistors 118 and 120 are all activated, the potential at the input of inverter 122 may be slightly higher than a reference power supply voltage. However, such a potential can be greatly lower than the threshold voltage of inverter 122. Thus, the change in impedance of PMOS transistor 116 during this time period does not affect the output of inverter 122, and the decoder output response X0 remains the same.

The decoder circuit 100 can quickly drive the input terminals of inverters 122 within AND function circuits 114-1 to 114-16. This can be accomplished by load impedance control circuit 104 placing PMOS load transistors 116 in a high impedance state in synchronism with the decoding operation of decoder circuit 100. In particular, active (high in this case) predecoder output signals (D0 to D7) can be applied to NMOS logical operation transistors 118 and 120 synchronously with PMOS load transistors 116 being placed in a high impedance state. In this way it can be possible to quickly activate (drive high in this case) a decoder output signal (X0 to X15) and accelerate the operation of a decoder circuit.

It is noted that the conventional logic circuit of FIG. 9 includes five MOS transistors and one inverter. In contrast, the AND function circuits 114-1 to 114-16 can include three MOS transistors and an inverter. A reduction in two decoder circuit elements can thus be realized.

Referring once again to FIG. 2, the LC waveform shows one particular approach for activating and turning off load devices. In particular, the VCC−Vtn potential can be about half the power supply potential VCC. Consequently, an arrangement such as that of FIG. 1 can require approximately half the charge/discharge current for activating load devices in comparison to conventional approaches with full logic swings. Thus, reductions in peak current requirements and/or power consumption can be realized.

Figure 3:
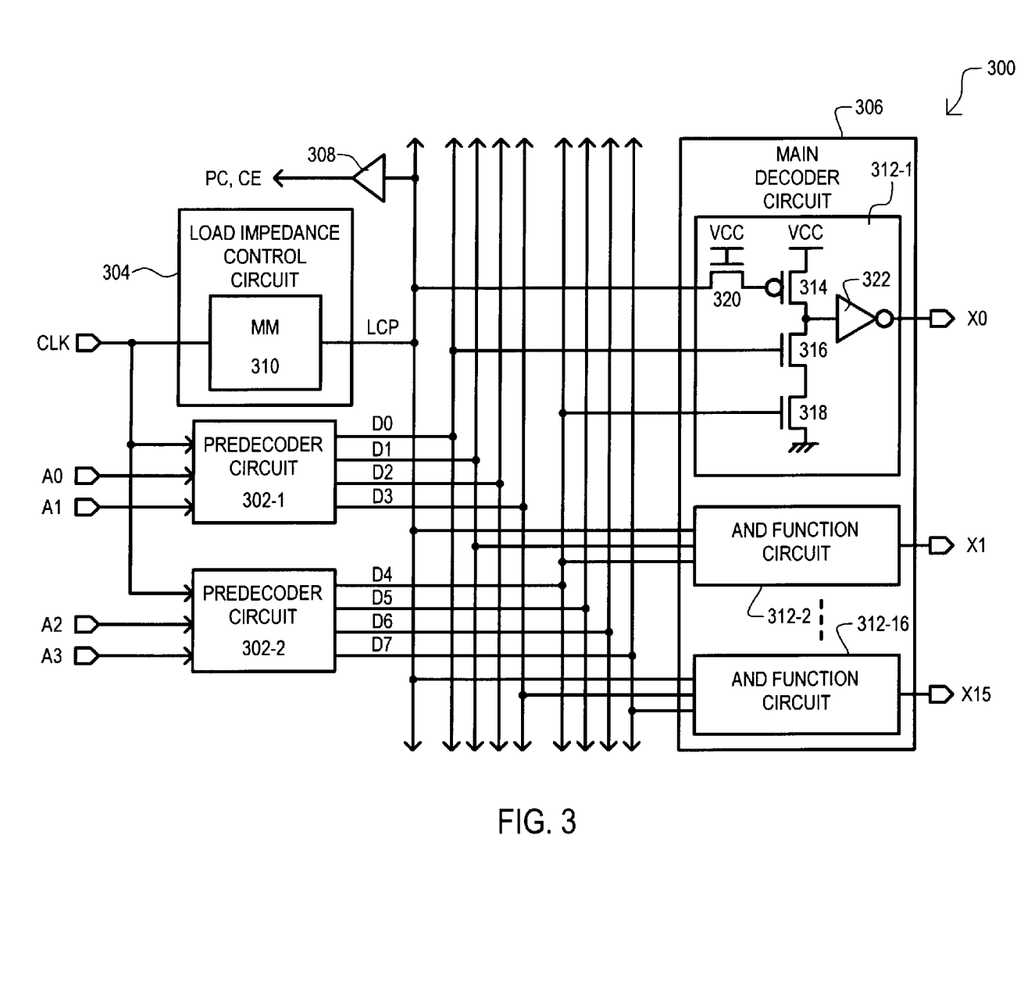
FIG. 3 is a block diagram showing a decoder circuit that may employ logic circuits according to a second embodiment of the present invention.

Referring now to FIG. 3, a block diagram is set forth illustrating a decoder circuit that includes logic circuits according to a second embodiment. The decoder circuit is designated by the general reference character 300, and is shown to include predecoder circuits 302-1 and 302-2 and a load impedance control circuit 304. The decoder circuit 300 also includes a main decoder circuit 306 and a buffer circuit 308.

A load impedance control circuit 304 can be a "monostable" circuit. A monostable circuit can provide an output that changes, but only temporarily, in response to an input condition. In the particular example of FIG. 3, a load impedance control circuit 304 can include a monostable multivibrator (MM) 310.

The load impedance control circuit 304 can generate a pulse of a predetermined duration in response to a rising edge of the CLK signal. This pulse can be an active load impedance control signal LCP. The load impedance control signal LCP may be supplied to other circuits (not shown) of a memory device through buffer 308. As just a few of the many possible examples, the load impedance control signal (LCD) can be used as a precharge signal (PC) that precharges digit lines in a memory array and/or data bus lines, or a sense amplifier select signal (SE) that can activate and/or select sense amplifiers within a memory cell array.

Main decoder circuit 306 can include a number of AND function circuits 312-1 to 312-16. AND function circuits (312-1 to 312-16) can include a PMOS transistor 314 and three NMOS transistors 316, 318 and 320, and an inverter 322. The AND function circuits (312-1 to 312-16) of FIG. 3 can have the same general arrangement as the AND function circuits (114-1 to 114-16) of FIG. 1 but with the addition of an NMOS transistor 320. NMOS transistor 320 can have a source that receives the load impedance control signal LCP, a drain connected to the gate of PMOS transistor 314, and a gate connected to a high power supply VCC.

NMOS transistor 320 can function as a transfer gate. When the load impedance control signal LCP is at a high level (e.g., greater than VCC−Vtn, where Vtn is the threshold voltage of NMOS transistor 322), the gate of PMOS load transistor 314 can receive a potential of VCC−Vtn. With a VCC-Vtn potential at its gate, the impedance of PMOS load transistor 314 can rise. When the load impedance control signal LCP is at a low level (e.g., a reference supply voltage) the gate of PMOS load transistor 314 can receive the reference supply voltage and have a relatively low impedance.

Figure 4:
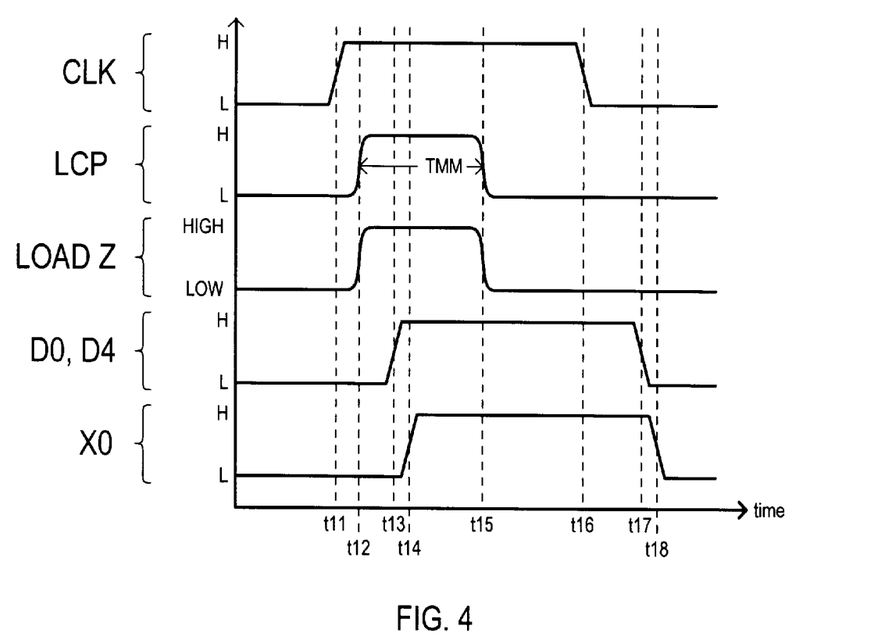
FIG. 4 is a timing diagram illustrating the operation of the decoder circuit of FIG. 3.

Referring now to FIG. 4, a timing diagram is set forth illustrating the operation of the decoder circuit of FIG. 3. FIG. 4 includes a number of waveforms, including a clock signal CLK, load impedance control signal LCP, a load transistor impedance LOAD Z, predecoder output signals D0, D4, and a decoder output signal X0.

In the timing arrangement of FIG. 4, the duration of the load impedance control signal LCP pulse is selected to be less than the half-cycle of the CLK signal. Such an arrangement can be advantageous if the LCP signal can also function as a precharge signal (PC) and/or a sense amplifier selection signal (SE).

One skilled in the art would recognize that waveforms D0, D4, and X0 can illustrate the particular operation of AND function circuit 312-1, and that the other AND function circuits 312-2 to 312-16 could operate in a similar fashion.

Referring now to FIG. 4 in conjunction with FIG. 3, the CLK signal can transition high at time t11. The rising edge of the clock signal CLK can result in load impedance control circuit 304 driving the load impedance control signal LCP high at time t12. According to timing criteria established by MM circuit 310, the load impedance control signal LCP will remain high for a duration shown as "TMM," and then return to a low level at time t15. While the load impedance control signal LCP is at a high level, the PMOS load transistors (such as 314) within AND function circuits (312-1 to 312-16) can have a high impedance.

Because predecoder circuits (302-1 and 302-2) can have a larger number of logic stages and/or a propagation delay that is greater than that of the load impedance control circuit 304, predecoder outputs (such as D0 and D4) can be driven high at time t13, which is delayed with respect to the rising edge of the clock signal CLK.

With the D0 and D4 signals high, NMOS transistors 316 and 318 can be activated. Because PMOS load transistor 314 continues to have a high impedance, the input to inverter 322 can be rapidly discharged to a low level. The low input value is inverted by inverter 322 and decoder output X0 can be driven high at time t14. In this way, the decoder 300 can rapidly activate decoder output values (such as X0).

At time t16, the clock signal CLK can return to a low level. The low transition in the clock signal CLK can result in activated predecoder output signals (such as D0 and D4), returning to a low level at time t17. With NMOS transistors 316 and 318 turned off, the input of inverter 322 can rise to a high level, resulting in the output of inverter 322 (decoder output signal X0) being driven low at time t18.

It is noted that PMOS load transistor 314 can be in a low impedance state at time t15. Thus, when NMOS transistors 316 and 318 are turned off at time t17, the input of inverter 322 can rapidly rise. In this way, the decoder 300 can rapidly de-activate decoder output values (such as X0).

Figure 5:
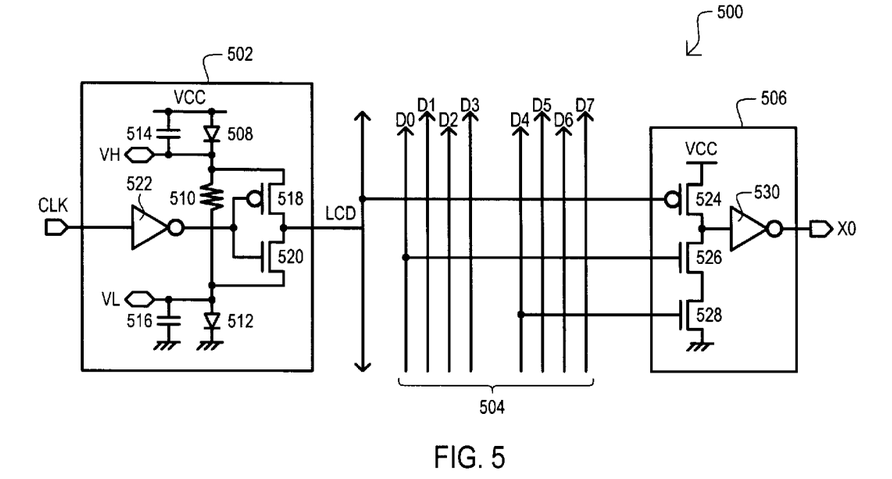
FIG. 5 is a block diagram of a third embodiment of the present invention.

FIG. 5 is a block diagram of a third embodiment. The third embodiment is designated by the general reference character 500 and can include portions of a decoder circuit.

The third embodiment 500 can include a load impedance control circuit 502, predecoder output lines 504, and an AND function circuit 506.

The load impedance control circuit 502 can provide an output signal that varies between a first intermediate level VH and second intermediate level VL. The first intermediate level VH can be less than a high power supply voltage VCC by a predetermined amount. The second intermediate level VL can be greater than a reference supply voltage (e.g., ground) by a predetermined amount. The output signal of the load impedance control circuit 502 can be a load impedance control signal LCD.

The particular load impedance control circuit 502 of FIG. 5 can include a first diode device 508, a bleeder resistance 510, and a second diode device 512 arranged in series between a high power supply VCC and a reference power supply. First diode device 508 can have an anode-type terminal connected to the high power supply VCC and a cathode-type terminal connected to bleeder resistance 510. Second diode device 512 can have an anode-type terminal connected to bleeder resistance 510 and a cathode-type terminal connected to the reference power supply. A first intermediate level VH can be generated at the connection between the cathode-type terminal of first diode device 508 and bleeder resistance 510. A second intermediate level VL can be generated at the connection between the anode-type terminal of second diode device 512 and bleeder resistance 510.

In such an arrangement, the first intermediate level VH can be equal to VCC−VfD, where VfD is a forward bias drop of a first diode device 508. The second intermediate level VL can be VSS+VfD, where VSS is the reference voltage supply and VfD is the forward bias drop of the second diode device 512.

The load impedance control circuit 502 may further include a capacitor 514 connected in parallel with first diode device 508 that can stabilize the first intermediate level VH. A capacitor 516 may be connected in parallel with second diode device 512 and may stabilize the second intermediate level VL.

One skilled in the art would recognize that a diode device may include various devices that provide a diode-like function. As but a few examples, a diode device can include a diode formed by a p-n junction, or the like, or a transistor, such as a bipolar transistor or field effect transistor connected in a "diode" configuration.

The load impedance control circuit 502 of FIG. 5 can also include a PMOS transistor 518, an NMOS transistor 520, and an inverter 522. PMOS transistor 518 can have a source connected to the first intermediate level VH, a drain connected to the drain of NMOS transistor 520, and a gate connected to the output of inverter 522. NMOS transistor 520 can have a source connected to the second intermediate level VL and a gate connected to the output of inverter 522. The input of inverter 522 can receive a clock signal CLK. Thus, an inverted clock signal is supplied to the gates of PMOS transistor 518 and NMOS transistor 520.

The drain-drain connection of PMOS transistor 518 and NMOS transistor 520 can generate the load impedance control signal LCD.

In the arrangement of FIG. 5, when the clock signal CLK is low, inverter 522 drives the gates of PMOS transistor 518 and NMOS transistor 520 to a high level. PMOS transistor 518 can be turned off while NMOS transistor 520 can be turned on. The load impedance control signal LCD can thus be at the second intermediate level VL.

When the clock signal CLK is high, inverter 522 drives the gates of PMOS transistor 518 and NMOS transistor 520 to a low level. PMOS transistor 518 can be turned on while NMOS transistor 520 can be turned off. The load impedance control signal LCD can be driven to the first intermediate level VH.

The load impedance control signal LCD can be supplied to a main decoder circuit, such as that shown as 106 in FIG. 1. Such a main decoder circuit can include a number of AND function circuits. One such AND function circuit is shown as 506 in FIG. 5. The AND function circuit 506 can have the same configuration as the AND function circuit shown as item 114-1 in FIG. 1. Thus, AND function circuit 506 includes a PMOS load transistor 524, NMOS load transistors 526 and 528, and an inverter 530.

When the clock signal CLK is at a low level, the load impedance control signal LCD can drive the gate of PMOS transistor 524 to the second intermediate level VL, and the PMOS transistor 524 can be placed in a low impedance state. When the clock signal CLK is at a high level, the load impedance control signal LCD can drive the gate of PMOS transistor 524 to the first intermediate level VH, and the PMOS transistor can be placed in a high impedance state.

When PMOS transistor 524 is in the high impedance state, predecoder signals D0 and D4 can be activated in synchronism with the CLK signal and in response to particular input values (such as address values). The input of inverter 530 can be driven to a low level. In this way the decoder output signal X0 can be rapidly driven to a high level.

In the embodiment of FIG. 5, the voltage amplitude range of the load impedance control signal LCD is smaller than that of the power supplies. Consequently, the amount of charge/discharge current for activating load devices can be less than that of a conventional approach with a full logic swing.

It is understood that while particular approaches to generating intermediate levels VH and VL have been described, other arrangements can be used, preferably those that are linearly stabilized. For example, other constant voltage source circuits could supply a first intermediate voltage and/or a second intermediate voltage instead of the diode device arrangement shown in FIG. 5.

Figure 6:
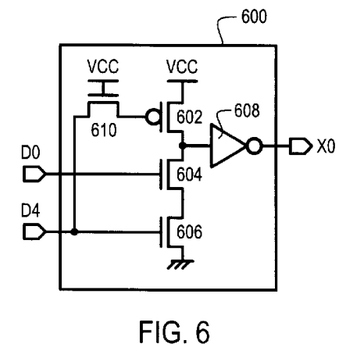
FIG. 6 is a circuit diagram of a fourth embodiment.

FIG. 6 is a circuit diagram of a fourth embodiment. The fourth embodiment is designated by the general reference character 600 and can include a logic circuit that provides an AND function. The AND function circuit 600 can include a PMOS load transistor 602, two NMOS transistors 604 and 606, and an inverter 608 arranged in the same fashion as AND function circuit 114-1 in FIG. 1. The fourth embodiment 600 may further include a load impedance control circuit that includes NMOS transistor 610.

NMOS transistor 610 can have a source connected to a predecoder output D4, a drain connected to the gate of PMOS transistor 602, and a gate connected to a high power supply VCC. NMOS transistor 610 can operate in the same general fashion as a transfer gate. When predecoder output D4 is low, the gate of PMOS transistor 602 can be low, and PMOS transistor 602 can be in a low impedance state. When predecoder output D4 is high (e.g., at VCC for example), the gate of PMOS transistor 602 can be at a VCC–Vtn level, where Vtn is the threshold voltage of NMOS transistor 610. PMOS transistor 602 can thus be placed in a high impedance state.

Thus, when predecoder outputs D0 and D4 are at a high level, NMOS transistors 604 and 606 can be turned on while PMOS transistor 602 is in a high impedance state. Thus, the input to inverter 608 can be rapidly driven to a low level, allowing decoder output signal X0 to be driven rapidly driven to a high level.

It is understood that an alternate arrangement to that of FIG. 6 can include an NMOS transistor 610 having a source connected to predecoder output D0 instead of D4.

The arrangement of FIG. 6 illustrates a case where predecoder output values can be driven at different times. In particular, the predecoder output D4 can be activated before the predecoder output D0 is activated. This can occur in an arrangement where one predecoder circuit that provides the D4 predecoder output has a shorter propagation time than another predecoder circuit that provides the D0 predecoder output. For example, in an arrangement such as that set forth in FIG. 1, predecoder circuit 102-2 drives predecoder outputs D4–D7 faster than predecoder circuit 102-1 drives predecoder outputs D0–D3.

In the arrangement of FIG. 6, predecoder output D4 will drive both the gate of NMOS transistor 606 and the source of NMOS transistor 610. Thus, if the predecoder output D4 is driven by a predecoder circuit (such as that shown as 102-2 in FIG. 1), the output load can be greater than the embodiment of FIG. 1 (where predecoder output D4 drives one NMOS transistor in an AND function circuit 114-1). Consequently, the activation of a decoder output signals, such as X0, may take longer than the previously described embodiments of FIGS. 1, 3 and 5.

Thus, embodiments such as 600 can include arrangements where predecoder outputs D4 to D7 are connected to larger loads than predecoder outputs D0 to D3. Provided predecoder outputs D4 to D7 are activated prior to predecoder outputs D0 to D3, the rapid activation of decoder output signals, such as X0, can be maintained. One particularly advantageous configuration can place a predecoder circuit that generates predecoder outputs D0 to D3 in a critical path that determines output timing for a decoder. In this way, a timing margin can be established between predecoder outputs D0 to D3 and predecoder outputs D4 to D7 that allows for fast activation of a decoder output, even if predecoder outputs D4 to D7 drive larger loads.

In the particular arrangement of FIG. 6, because load impedances can be controlled according to input signals to a logic circuit (such as D0 and D4), it can be unnecessary to provide wirings for a load impedance control signal, such as LC, LCP and LCD shown in FIGS. 1, 3 and 5. In this way, the fourth embodiment 600 can have fewer wiring regions than the embodiments of FIGS. 1, 3 and 5.

In the embodiments of FIGS. 1, 3 and 5, a load impedance control signal (such as LC, LCP and LCD) can drive impedance devices in all the AND function circuits. In contrast, in the embodiment of FIG. 6, only selected impedance devices will be driven. For example, in a four bit decoding scheme that uses AND function circuits of the fourth embodiment 600, the impedance devices in four out of sixteen AND functions circuits are activated for given combinations of address values. Therefore, the fourth embodiment 600 can provide current savings over the previously described embodiments.

Figure 7:
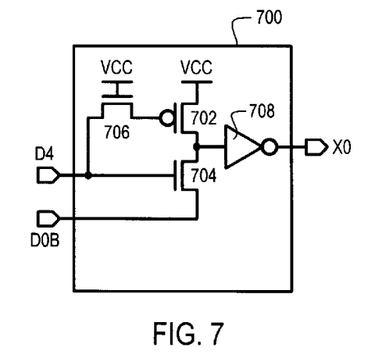
FIG. 7 is a circuit diagram of a fifth embodiment.

FIG. 7 shows a circuit diagram of a fifth embodiment. The fifth embodiment is a logic circuit and designated by the general reference character 700. The fifth embodiment 700 is an AND function circuit that can be conceptualized as a modification of the fourth embodiment 600.

The fifth embodiment 700 may include a PMOS transistor 702, two NMOS transistors 704 and 706, and an inverter 708. PMOS transistor 702 can have a source connected to a high power supply VCC, a drain connected to the drain of NMOS transistor 704, and a gate connected to the drain of NMOS transistor 706. NMOS transistor 706 can have a source connected to predecoder output D4 and a gate connected to the high power supply VCC. NMOS transistor 704 can have a gate connected to predecoder output D4. Unlike the fourth embodiment 600, the source of NMOS transistor 704 can be connected to an inverted predecoder output D0B. An inverted predecoder output D0B may be generated by inverting a predecoder output D0. It is noted that the fifth embodiment 700 has one less transistor than the fourth embodiment 600.

In the fifth embodiment 700, PMOS transistor 702 can be a load device, NMOS transistor 704 can be a logical operation transistor, and NMOS transistor 706 can be a load impedance control circuit.

When the predecoder output D4 is high (greater than VCC−Vtn), PMOS transistor 702 can receive a potential VCC−Vtn at its gate and its impedance can rise. If the predecoder output D0B is low, NMOS transistor 704 can be activated and the input of inverter 708 can be driven low. A decoder output X0 can then be driven high by inverter 708.

Multiple numbers of AND function circuits 700 according to the fifth embodiment can be used in a main decoder circuit. In such a main decoder it can be possible for adjacent AND function circuits 700 to share circuit elements. In particular, in the example of FIG. 7, an adjacent AND function circuit could share NMOS transistor 706. Thus, predecoder output D4 can be supplied to the source of an NMOS transistor that is adjacent and common to two AND function circuits. By using AND function circuits 700 with elements in common, the number of elements within an AND function circuit may be further reduced. Specifically, if it is assumed that inverter 708 includes two transistors, an arrangement of sharing AND function circuits 700 can have 4 or 5 circuit elements. This is in contrast to the conventional case of FIG. 9, which can use 7 elements. In this way, the number of elements in an AND function circuit (such as the fifth embodiment 700) can be reduced to less than ⅔ third that of a conventional case (such as that in FIG. 9).

Figure 8:
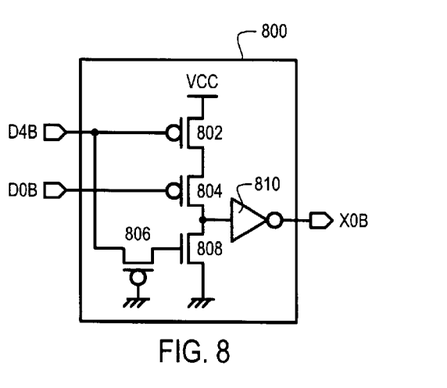
FIG. 8 is a circuit diagram of a sixth embodiment.

FIG. 8 shows a circuit diagram of a sixth embodiment. The sixth embodiment is a logic circuit and designated by the general reference character 800. The sixth embodiment 800 is an OR function circuit that may form one portion of a main decoder circuit. The OR function circuit 800 can be conceptualized as including a NOR circuit and an inverter.

The OR function circuit 800 may include three PMOS transistors 802, 804, and 806, and an NMOS transistor 808. These transistors can be conceptualized as forming a NOR circuit. An inverter is also included, shown as item 810. PMOS transistor 802 can have a source connected to a high power supply VCC, a drain connected to the source of PMOS transistor 804, and a gate that receives an inverted predecoder output D4B. PMOS transistor 804 can have a drain connected to the drain of NMOS transistor 808, and a gate that receives another inverted predecoder output D0B. NMOS transistor 808 can have a gate connected to the drain of PMOS transistor 806, and a source connected to a reference power supply. PMOS transistor 806 can have a source that receives inverted predecoder output D4B and a gate connected to reference voltage supply (e.g., ground).

In the arrangement of FIG. 8, PMOS transistors 802 and 804 can be logical operation transistors, NMOS transistor 808 can be a load transistor, and PMOS transistor 806 can be a load impedance control circuit.

An inverted predecoder output D0B can be generated by inverting a predecoder output D0. An inverted predecoder output D4B can be generated by inverting a predecoder output D4.

When the input signals D4B and D0B are at a low level, PMOS transistors 802 and 804 can be turned on to provide a low impedance path between the high power supply and the input of inverter 810. The low D4B value can result in a low potential (Vss+|Vtp|) being applied to the gate of NMOS transistor 808, placing NMOS transistor 808 in a high impedance state. The input of inverter 810 can be at a high level resulting in a low X0B output signal.

By controlling the impedance of NMOS transistor 806 according to inverted predecoder output signal D4B, the OR function circuit 800 can rapidly drive the X0B signal to a high level.

When the D4B signal transitions to a high level, a high level can be applied to the gate of NMOS load transistor 808. NMOS transistor 808 can thus be placed in a low impedance state through PMOS transistor 806. PMOS transistor 804 and possibly PMOS transistor 802 can be turned off. The input of inverter 810 can be discharged to a low level through NMOS transistor 808. This can allow the X0B signal to be rapidly driven to a high level.

One skilled in the art would recognize that while AND/NAND and OR/NOR logic gates have been described, the present invention should not be construed as being limited to such particular logic circuits. The teachings of the various embodiment can be utilized to build alternate embodiments that provide logic functions other than an AND/NAND and/or OR/NOR function. Such alternate embodiment could include, without limitation, encoder circuits, latch circuits and/or a bus control circuit.

The various embodiments have illustrated logic circuits that include a load impedance control circuit that may change the impedance of a load device according to the value of an output value. In the case of a logic circuit configured to provide a low output level by discharging current provided by a load device, it can be possible to provide a faster circuit response and reduced current consumption by increasing the impedance of the load device. In the event a high level is output, it can be possible to increase response time by decreasing the impedance of the load device.

In the case of a logic circuit configured to provide a high output level by supplying current to a load device, it can be possible to provide a faster circuit response and reduced current consumption by increasing the impedance of the load device. In the event a low level is output, it can be possible to increase response time by decreasing the impedance of the load device.

One skilled in the art would recognize that two signals may be "synchronous" with one another, or activated "in synchronism" without necessarily being simultaneous. As just one example, while the clock signal CLK and load impedance control signal LC of FIG. 1 may be synchronous, they are not exactly simultaneous.

One skilled in the art would also recognize that the various logic circuits described can generate a logic value at a logic node that may be subject to other manipulations to generate an output value. As but a few examples, the input of inverters 122, 322, 530, 608, 708, and 810 can be a logic node. The potential of the logic node is subsequently manipulated by an inverter.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A logic circuit, comprising:
   at least one logical operation transistor having a first conductivity type that performs a logic function according to at least one input signal;
   at least one load transistor having a second conductivity type that is a load for the at least one logical operation transistor, the at least one load transistor including at least one control terminal; and
   a load impedance control circuit coupled to a power supply voltage, the load impedance control circuit changing the impedance of the at least one load transistor by controlling the potential of the at least one control terminal of the at least one load transistor according to a load impedance control signal having a potential that is less in magnitude than the power supply voltage by a predetermined value.

2. The logic circuit of claim 1, wherein:
   the load impedance control circuit raises the impedance of the at least one load transistor synchronously with transitions in the at least one input signal.

3. The logic circuit of claim 1, wherein:
   the load impedance control circuit raises the impedance of the at least one load transistor in response to a predetermined value of the at least one input signal.

4. The logic circuit of claim 1, wherein:
   the load impedance control circuit is coupled to a reference voltage and changes the impedance of the at least one load transistor by selectively outputting a load impedance control signal having a potential that is less than the power supply voltage by a predetermined value and greater than the reference voltage by a predetermined value.

5. The logic circuit of claim 1, wherein:
   the load impedance control circuit includes an n-channel insulated gate field effect transistor (IGFET) having a source-drain path disposed between the control terminal of the load transistor and an input signal terminal, the gate of the n-channel IGFET being coupled to a power supply voltage.

6. A logic circuit, comprising:
   a load controllable impedance path disposed between a logic node and a first supply node, the load controllable impedance path having an impedance determined according to the potential at a load control node and including at least one load field effect transistor (FET) of a first conductivity type having a source-drain path coupled between the logic node and the first supply node and a gate coupled to the load control node;
   a logic controllable impedance path disposed between the logic node and a second supply node, the logic controllable impedance path having an impedance determined according to the potential of at least one input signal node and including at least one logic FET of a second conductivity type having a source-drain path coupled between the logic node and the second supply node and a gate coupled to at least one input signal node; and
   a load control circuit that changes the potential of the load control node according to the potential at a control input node and limits the potential of the load control node to less than the first supply node.

7. The logic circuit of claim 6, wherein:
   the second supply node is coupled to the at least one input signal node.

8. The logic circuit of claim 6, wherein:
   the load control circuit includes a control field effect transistor (FET) having a source-drain path coupled between the load control node and the control input node, and a gate coupled to the first supply node.

9. The logic circuit of claim 8, wherein:
   the control input node is coupled to the at least one input signal node.

10. The logic circuit of claim 6, wherein:
    the load control circuit includes
    a first control field effect transistor (FET) having a source-drain path coupled between a first control supply node and the load control node, and a gate coupled to the control input node, and
    a second control FET having a source-drain path coupled between a second control supply node and the load control node, and a gate coupled to the control input node.

11. The logic circuit of claim 10, wherein:
    the gate of the second control FET is coupled to the load control node by an inverter.

12. The logic circuit of claim 10, wherein:
    the first control supply node can have a lower potential than the first supply node, and
    the second control supply node can have a higher potential than the second supply node.

13. The logic circuit of claim 6, wherein:
    the load control circuit includes a monostable circuit that temporarily drives the load control node to a predetermined potential in response to changes in potential at the control input node.

14. A decoder circuit, comprising:
    a plurality of logic circuits, each logic circuit including
    a load current path coupled to a power supply having an impedance that varies according the potential at a load control node, and
    a logic current path having an impedance that varies according to the potential of at least one logic input node; and
    a load impedance control circuit coupled to the power supply, the load impedance control circuit driving selected load control nodes of the logic circuits in synchronism with changes in potential at the logic input nodes of the logic circuits and changing the impedance of the load current path by driving selected control nodes to a potential that is less in magnitude than the power supply by a predetermined value.

15. The decoder of claim 14, wherein:
    the load current path includes a field effect transistor having a gate coupled to the load control node.

16. The decoder of claim 14, wherein:
    adjacent logic circuits have commonly coupled load control nodes.

17. The decoder of claim 14, wherein:
    the load impedance control circuit includes a field effect transistor having a source-drain path coupled to the load control node and a gate coupled to the power supply.

18. The decoder of claim 14, further including:
    a plurality of predecoder circuits having predecoder outputs coupled to the logic input nodes of the logic circuits, each predecoder circuit driving selected predecoder output nodes according to input address values.

* * * * *